(12) United States Patent
Bicaïs et al.

(10) Patent No.: US 11,381,202 B2
(45) Date of Patent: Jul. 5, 2022

(54) ENVELOPE-DETECTING CIRCUIT AND RECEIVER INCORPORATING THIS CIRCUIT

(71) Applicant: Commissariat à l'Energie Atomique et aux Energies Alternatives, Paris (FR)

(72) Inventors: Simon Bicaïs, Grenoble (FR); Jean-Baptiste Dore, Grenoble (FR); Benoît Miscopein, Grenoble (FR)

(73) Assignee: Commissariat à l'Energie Atomique et aux Energies Alternatives, Paris (FR)

( * ) Notice: Subject to any disclaimer, the term of this patent is extended or adjusted under 35 U.S.C. 154(b) by 3 days.

(21) Appl. No.: 17/126,877

(22) Filed: Dec. 18, 2020

(65) Prior Publication Data

US 2021/0194431 A1 Jun. 24, 2021

(30) Foreign Application Priority Data

Dec. 20, 2019 (FR) ..................................... 19 15275

(51) Int. Cl.
*H03D 1/18* (2006.01)
*H04B 1/10* (2006.01)
*H04B 1/30* (2006.01)

(52) U.S. Cl.
CPC ................. *H03D 1/18* (2013.01); *H04B 1/10* (2013.01); *H04B 1/30* (2013.01)

(58) Field of Classification Search
CPC ... H03D 1/18; H04B 1/10; H04B 1/30; H04B 1/22; H01R 24/40–52; H01R 13/646;
(Continued)

(56) References Cited

U.S. PATENT DOCUMENTS 3,508,155 A 4/1970 Voelcker, Jr.
4,489,280 A * 12/1984 Bennett, Jr. .......... G06G 7/1928
327/98
(Continued)

OTHER PUBLICATIONS

French Preliminary Search Report dated Aug. 27, 2020 in French Application 19 15275 filed Dec. 20, 2019 (with English Translation of Categories of Cited Documents and Written Opinion), 11 pages.
Mecozzi, A. et al., "Kramers-Kronig coherent receiver," OPTICA, vol. 3, No. 11, Nov. 20, 2016, XP002773963, 8 pages.
Zaid, M. A. M. A., et al., "Envelope Detection and Correction of SSB," Electronics Letters. vol. 20, No. 22, Oct. 25, 1984, XP055723119, 2 pages.
(Continued)

*Primary Examiner* — Jinsong Hu
*Assistant Examiner* — Rui M Hu
(74) *Attorney, Agent, or Firm* — Oblon, McClelland, Maier & Neustadt, L.L.P.

(57) ABSTRACT

This envelope-detecting circuit comprises:
  a first multiplier able to multiply a first example of a signal received on an input port by itself,
  a modifier able to modify the amplitude of the power spectrum, of a second example of the signal received on the input port, at the frequency $f_c$ without modifying the amplitude of this power spectrum in a useful frequency band,
  a second multiplier able to multiply the modified signal by itself,
  a subtractor able to subtract from each other the signals delivered by the multipliers,
  a filter able to remove frequency components higher than or equal to $2f_c$ in a signal obtained from the signal delivered by the subtractor, this filter being able to deliver the result of this filtering on an output connected to an output port of the envelope-detecting circuit.

6 Claims, 2 Drawing Sheets

(58) Field of Classification Search
CPC .... H01R 13/719; H03G 3/3036; H03F 3/189; H01P 3/04; H02M 5/225; H02M 5/27; H05H 1/30; H05H 1/18; H05H 1/46
See application file for complete search history.

(56) References Cited

U.S. PATENT DOCUMENTS

| | | | | |
|---|---|---|---|---|
| 4,631,489 A | * | 12/1986 | Laird | H03G 3/3068 |
| | | | | 375/345 |
| 5,757,439 A | * | 5/1998 | Kim | H04N 9/68 |
| | | | | 348/E9.053 |
| 5,901,173 A | * | 5/1999 | Stephens | H03G 3/3052 |
| | | | | 375/345 |
| 2012/0028594 A1 | * | 2/2012 | Rao | H03D 3/009 |
| | | | | 455/207 |

OTHER PUBLICATIONS

Anonymous, "Amplitude modulation," https•//en.wikipedia.org/w/index.php?title=Aplitude_modulation&oldid=929193037, extracted from the internet: Aug. 18, 2020, XP055723381, 12 pages.

Voelcker, H., "Demodulation of Single-Sideband Signals via Envelope Detection," IEEE Transactions on Communication Technology, vol. com-14, No. 1,Feb. 1966, 9 pages.

Srinivasan, M. et al., "Comparison of Prime Code, Extended Prime Code and Quadratic Congruence Code using a Normalized Throughput Metric," Proceedings of 2004 6th International Conference on Transparent Optical Networks (IEEE Cat. No. 04EX804), Jul. 4-8, 2004, 4 pages.

Proakis, J. G., "Digital Communications: Fourth Edition," www.GetPedia.com, ISBN 0072321113, published Aug. 28, 2020, 938 pages.

* cited by examiner

ENVELOPE-DETECTING CIRCUIT AND RECEIVER INCORPORATING THIS CIRCUIT

The invention relates to an envelope-detecting circuit and method and to a receiver incorporating this envelope-detecting circuit. The invention also relates to a transmitter specially arranged to work with this receiver.

In this text, the expression "high-frequency band" designates a continuous frequency band located above 30 GHz or above 90 GHz. Generally, such a high-frequency band does not extend above 1000 GHz or above 1000 THz or 3000 THz.

The increasing demand for data rate from users has led to the emergence of new technological solutions in the latest generation of mobile telecommunication networks, i.e. solutions such as massive MIMO (Multiple Input Multiple Output), cellular densification by means of small cells, and multi-RAT (Radio Access Technology) access which conjointly exploits a band below 6 GHz and the millimeter band. More recently, it has been proposed to use high-frequency bands between 100 and 300 GHz, which are referred to as sub-THz bands, for very high data-rate communications. These sub-THz communications are for example envisioned for point-to-multipoint links where a base station transmits downlink data at a very high data rate over a small distance to a plurality of mobile terminals. They are also envisioned for setting up point-to-point links between base stations in a backhaul network, or even very short-range links.

The exploitation of high-frequency bands however assumes the solution of problems with the power consumption and stability of high-frequency oscillators. The difficulty encountered in producing stable high-frequency oscillators in this frequency range means that sub-THz communication systems are very sensitive to phase noise.

Phase noise affects both the high-frequency oscillator of the transmitter and that of the receiver. To this phase noise is added the conventional problem of CFO (carrier frequency offset), i.e. of offset between the frequency of the oscillator of the receiver and that of the oscillator of the transmitter. The symbol error rate may then become very high.

Various strategies for minimizing the impact of the phase noise of high-frequency oscillators on communication performance have been proposed in the prior art. In this regard, mention may be made of the optimization of the modulation and the demodulation for channels containing phase noise. However, this strategy leads to complex algorithms and radiofrequency architectures, and hence does not always meet the conditions required by the envisioned sub-THz applications. In addition, in this case the symbol error rates are limited by an error floor that may be high.

One alternative is to consider using a receiver employing envelope detection and thus to avoid use of a high-frequency oscillator in the receiver and the negative impact of its phase noise. However, at the present time, envelope detection only allows non-coherent demodulation. This makes it difficult to achieve the high data rates envisioned for sub-THz applications, as the spectral efficiency of non-coherent communications is limited.

Lastly, mention should be made of the article by H. Voelcker entitled "Demodulation of single-sideband signals via envelope detection", IEEE Transactions on Communications Technology, vol. 14, no 1, February 1966. This article corresponds to U.S. Pat. No. 3,508,155. This article demonstrates that the insertion of a pure carrier into the spectrum allows the signal of interest to be demodulated coherently on the basis of an envelope detection. Self-mixing is spoken of. However, the latter strategy is suboptimal in so far as it requires the transmission of a pure carrier of high power compared to the useful signal and thus leads to a substantial increase in transmission power. In addition, the receiver described in the article by H. Voelcker requires complex operations, such as a Hilbert transform, to be carried out on the received signal. This makes this receiver difficult to implement.

Prior art is also known from the following articles:
Antonio MECOZZI et al.: "Kramers-Kronig coherent receiver", OPTICA, vol. 3, No 11, 20 Nov. 2016, pages 1220-1227,
M. A. M. A Zaid et al.: "Envelope detection and correction of SSB", Electronics letters, vol. 20, no 22, 1 Jan. 1984, page 901.

The invention aims to provide a new radiofrequency transmission architecture that solves at least one of the aforementioned drawbacks.

One subject thereof is therefore an envelope-detecting circuit.

Another subject of the invention is a receiver for receiving a modulated signal comprising an envelope modulated by a carrier at a preset frequency $f_c$ comprised in the high-frequency band.

Another subject of the invention is a method for detecting the envelope of a signal modulated in a high-frequency band.

The invention will be better understood on reading the following description, which is given merely by way of nonlimiting example with reference to the drawings, in which.

In these figures, the same references have been used to designate elements that are the same. In the rest of this description, features and functions well known to those skilled in the art are not described in detail.

Section 1: Examples of Embodiment

In this section, a detailed and analytical description of one embodiment of the radiofrequency transmission chain is given with reference to FIGS. 1 to 5. This embodiment is described in the particular case of a communication system with N sub-carriers, where N is an integer number higher than two. Specifically, employing sub-carriers in parallel allows very high digital-symbol rates to be achieved using slow analog-digital converters. For example, N is higher than $2^2$ or $2^3$ or $2^4$. In addition, generally, N is lower than $2^{20}$. Below, the index j is used to identify a sub-carrier. This index j is therefore comprised between 1 and N.

Each of these sub-carriers forms an information-transmission channel that is independent of the other channels. Thus, the information transmitted over one of these channels may be completely independent of the information transmitted in parallel over the other channels. Below, the index j is also used to identify one particular channel among all the available channels.

Figure 4:
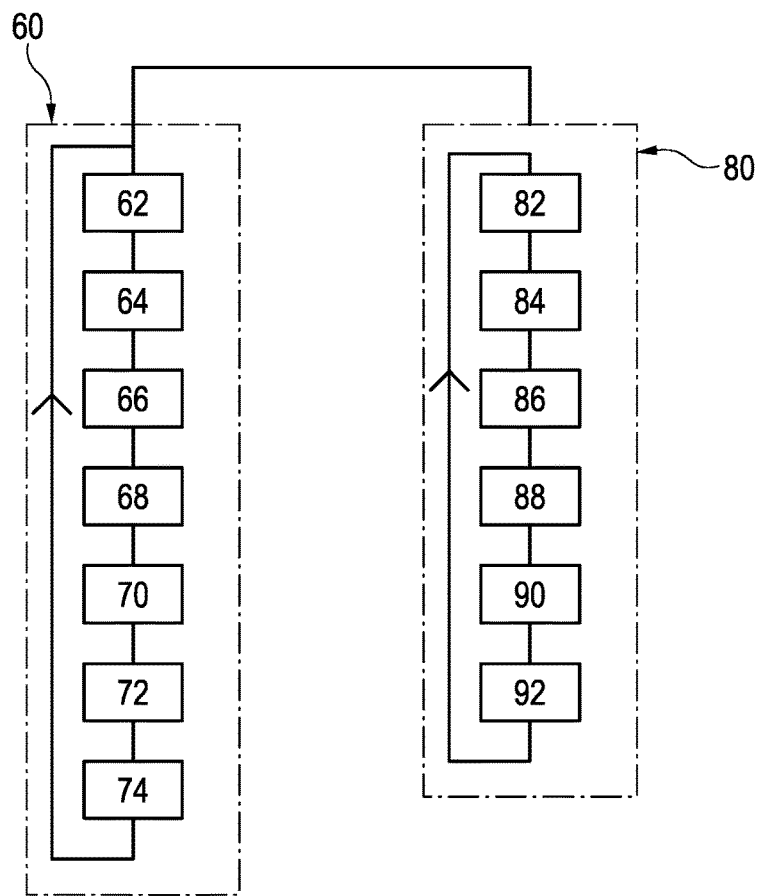
FIG. 4 is a flowchart of a method for transmitting and receiving a signal modulated in a high-frequency band using the transmitter of FIG. 1 and the receiver of FIG. 2.

Below, the hardware architectures of a transmitter 2 and of a receiver 4 used to implement the transmitting method of FIG. 4 are briefly introduced. Details on the operation of each of the elements of these hardware architectures are then given with reference to FIGS. 4 and 5.

Figure 1:
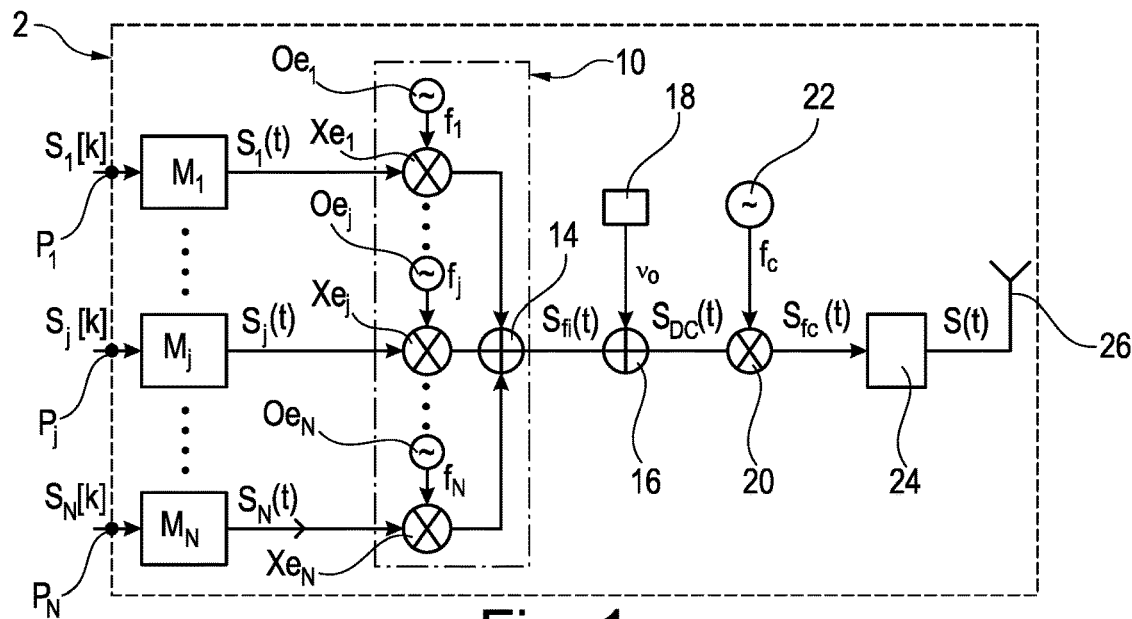
FIG. 1 is a schematic illustration of the architecture of a transmitter of a signal modulated in a high-frequency band.
Figure 2:
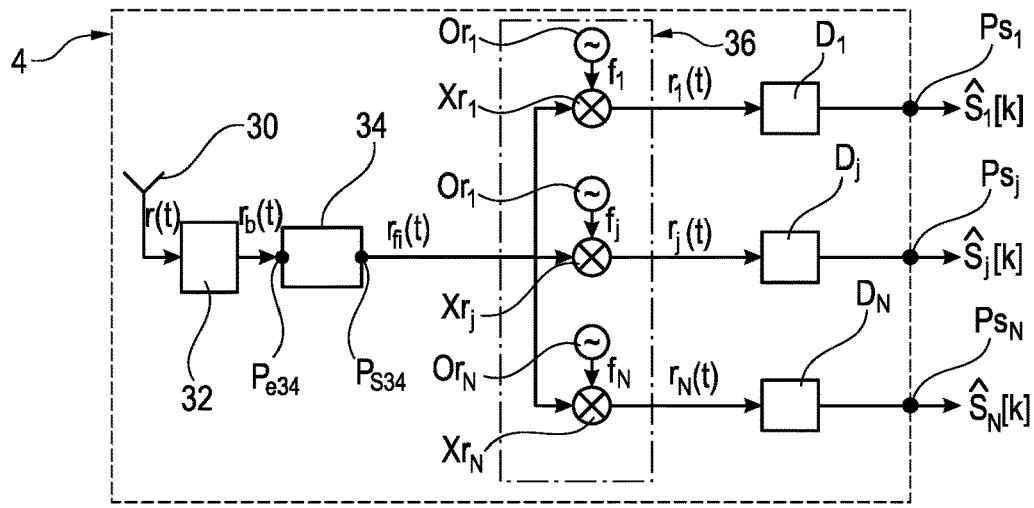
FIG. 2 is a schematic illustration of the architecture of a receiver of a signal transmitted by the transmitter of FIG. 1.

The transmitter 2 comprises N input ports $P_1$ to $P_N$. Each port P, is connected to a respective source of digital symbols (which is not shown in the figures). In FIG. 1, as in the other figures, the symbol " . . . " indicates that certain elements have not been shown to simplify the illustration. However, the elements not shown may be easily deduced from the explanations given in this text.

Each port $P_j$ is connected to one input of a modulator $M_j$. The modulator $M_j$ modulates each symbol $S_j[k]$ received on its input to generate as output a corresponding modulated analog signal $S_j(t)$.

The outputs of the modulators $M_j$ are connected to respective inputs of a circuit 10 for distributing the N signals $S_j(t)$ to N separate sub-carriers. The circuit 10 generates as output a signal $s_{fi}(t)$ in an intermediate frequency band in which each signal $s_j(t)$ modulates one respective sub-carrier. To this end, the circuit 10 comprises, for each signal $s_j(t)$, a multiplier $Xe_j$ one input of which receives the signal $s_j(t)$ and one input of which is connected to the output of a respective oscillator $Oe_j$. The oscillator $Oe_j$ generates on its output a carrier at the frequency $f_j$. The multiplier $Xe_j$ multiplies the signals received on its inputs and delivers the result of this multiplication on its output.

The circuit 10 also comprises an adder 14 that comprises N inputs each connected to one output of a respective multiplier $Xe_j$. The adder 14 adds the outputs of each of the multipliers $Xe_j$ and delivers as output the signal $s_{fi}(t)$.

The output of the circuit 10 is connected to one input of an adder 16. Another input of the adder 16 is connected to an output of a DC voltage generator 18. The generator 18 delivers a DC voltage of constant amplitude $v_0$. The adder 16 generates as output a signal $s_{DC}(t)$.

The output of the adder 16 is connected to one input of a multiplier 20. Another input of the multiplier 20 is connected to an output of a high-frequency oscillator 22. The oscillator 22 generates on its output a carrier at the frequency $f_c$. The multiplier delivers on its output a signal $s_{fc}(t)$ that is the result of the multiplication by each other of the signals received on its inputs.

The output of the multiplier 20 is connected to an input of a filter 24. As output, the filter 24 delivers the filtered signal s(t).

The signal s(t) is transmitted to the receiver 4 via a point 26 of output. Here, the point 26 of output is an antenna that radiates over the air the signal s(t) in the direction of the receiver 4.

The receiver 4 (FIG. 2) comprises a point 30 of input that receives the signal radiated by the transmitter 2. Here, this point 30 is an antenna. The point 30 delivers a received electrical signal r(t) to an input of a filter 32.

The filter 32 delivers on its output a filtered signal $r_b(t)$.

The output of the filter 32 is connected to an input port $P_{e34}$ of an envelope-detecting circuit 34. The circuit 34 generates on an output port $P_{s34}$ a signal $r_{fi}(t)$. The circuit 34 is used for the frequency conversion from the high-frequency band to the intermediate band. This function is conventionally carried out via a high-frequency oscillator associated with a mixer. However, as indicated above, the performance of high-frequency oscillators is mediocre and they induce much phase noise the impact of which on the communication performance is disastrous. The circuit 34 carries out this frequency conversion while attenuating the impact of phase noise.

The port $P_{s34}$ is connected to the input of a circuit 36 for isolating sub-carriers. The circuit 36 carries out the inverse of the operation carried out by the circuit 10. To this end, the circuit 36 comprises N multipliers $Xr_j$. Each multiplier $Xr_j$ comprises an input connected to the port $P_{s34}$ of the circuit 34, and another input connected to a respective oscillator $Or_j$. The oscillator $Or_j$ generates on its output a carrier at the frequency $f_j$. Each multiplier $Xr_j$ delivers on its output a signal $r_j(t)$ that is the result of the multiplication of the signals received on its inputs.

The output of each multiplier $Xr_j$ is connected to the input of a respective demodulator $D_j$. The demodulator $D_j$ constructs, from the signal $r_j(t)$, an estimation $\hat{s}_j[k]$ of the symbol $s_j[k]$ transmitted by the transmitter at the time k over the channel j. The demodulator $D_j$ therefore carries out the inverse of the operation carried out by the modulator $M_j$.

Figure 3:
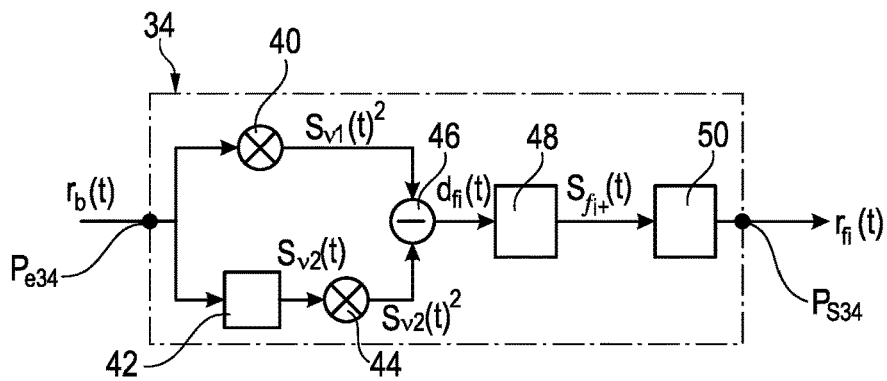
FIG. 3 is a schematic illustration of the architecture of an envelope-detecting circuit employed in the receiver of FIG. 2.

FIG. 3 shows in more detail an example of the hardware architecture of the envelope-detecting circuit 34. The input port $P_{e34}$ of the circuit 34 is connected on the one hand to an input of a multiplier 40 and on the other hand to an input of a modifier 42. Thus, the multiplier 40 and the modifier 42 both receive an example or copy of the same signal $r_b(t)$.

The multiplier 40 multiplies the signal received on its input by itself and delivers on its output the result of this multiplication, i.e. here a signal $s_{v1}(t)^2$. For example, the multiplier 40 is a self-mixer of frequencies.

In this embodiment, the modifier 42 is a filter that filters the signal $r_b(t)$ and delivers on its output the modified signal $s_{v2}(t)$.

The output of the modifier 42 is connected to the input of a multiplier 44. The multiplier 44 multiplies by itself the signal $s_{v2}(t)$ to obtain a signal $s_{v2}(t)^2$. The signal $s_{v2}(t)^2$ is delivered on the output of the multiplier 44.

The outputs of the multipliers 40 and 44 are connected to respective inputs of a subtractor 46. The subtractor 46 subtracts the signals received on its inputs to obtain a difference signal $d_{fi}(t)$. The signal $d_{fi}(t)$ is delivered on the output of the subtractor 46.

The output of the subtractor 46 is connected to the input of a divider 48. The divider 48 divides the amplitude of the signal received on its input by a constant to obtain a signal $s_{fi+}(t)$. The result of this division is delivered on an output of the divider 48.

The output of the divider 48 is connected to an input of a filter 50. The filter 50 generates the signal $r_{fi}(t)$ on the output port $P_{s34}$ of the circuit 34.

The method of FIG. 4 may be divided into two broad parallel phases, namely a phase 60 of transmitting the signal with the transmitter 2 and, in parallel, a phase 80 of receiving this transmitted signal with the receiver 4.

The phase 60 starts with a step 62 of acquiring the various digital symbols $S_h[k]$ to be transmitted in parallel at a time k on each of N input ports $P_1$ to $P_N$. Each acquired symbol $S_j[k]$ is, typically, coded in binary.

In a step 64, for each of the channels j, the symbols $S_j[k]$ received in this channel j are modulated by the modulator $M_j$. Any type of modulation may be used by the modulator $M_j$ to modulate a digital symbol in a channel. For example, it may be a coherent modulation such as quadrature amplitude modulation (QAM) or of phase shift keying (PSK). It may also be an orthogonal modulation such as frequency shift keying (FSK) or pulse position modulation (PPM), inter alia. In this example, it is a coherent modulation. In this case, the modulated analog signal $s_j(t)$ generated by the modulator $M_j$ is expressed by the following relationship, relationship (1):

$$s_j(t) = \sum_k s_j[k] \cdot g(t - kT)$$

where:
$s_j(t)$ is the modulated analog signal in channel j at time t,
$s_j[k]$ is the modulated digital symbol at time k in channel j,
T is the duration of a digital symbol,
g is the impulse response of a shaping filter of limited band and unit energy.

In this description, the symbol "·" designates the operation of multiplication.

By way of illustration, here, the shaping filter is a shaping filter that meets the Nyquist criterion. However, other shaping filters are possible.

To transmit each signal $s_j(t)$ in parallel, each of the signals $s_j(t)$ is transmitted over one respective channel j. To this end, in a step 66, the circuit 10 distributes each signal $s_j(t)$ to a respective sub-carrier $\psi_j(t)$ of an orthogonal basis $\{\psi_j\}$ of N sub-carriers. This step of distributing the modulated signals $s_j(t)$ to the respective sub-carriers is known as carrier mapping or by the term "synthesis operator" in linear algebra. The time-dependent signal $s_{fi}(t)$ comprising the N sub-carriers and coding the N signals $s_j(t)$ transmitted in parallel is defined by the following relationship, relationship (2):

$$s_{f_i}(t) = \sum_j s_j(t) \cdot \psi_j(t)$$

In this text, each summation over the index j is a summation from j=1 to j=N.

Most of the power of the signal $s_{fi}(t)$ is comprised in an intermediate frequency band $B_{fi}$. In this text, by "most of the power of a signal is comprised in a frequency band [$f_{min}$, $f_{max}$]", what is meant is that at least 80% or 90% or 95% of the power of this signal is comprised in the band [$f_{min}$, $f_{max}$]. In other words, the area of the power spectrum of this signal comprised in the interval [$f_{min}$, $f_{max}$] represents more than 80% or 90% or 95% of the total area of this power spectrum. The intermediate band $B_{fi}$ is centered on an intermediate frequency that is denoted $f_i$ below. The width of the intermediate band $B_{fi}$ is denoted $L_u$ below. Generally, the frequency $f_i$ is lower than or equal to 2 $L_u$. For example, here, the frequency $f_i$ is comprised between 0.5 $L_u$ and 1.5 $L_u$. The band $B_{fi}$ is separated from the frequency of zero by a margin of safety. The width of this margin of safety is denoted $\Delta$. The power of the signal $s_{fi}(t)$ inside the margin of safety is zero or negligible. Here, the frequencies $f_j$ of the sub-carriers are chosen to achieve the best possible compromise between the two following criteria:
1) The width $\Delta$ must be as small as possible to maximize spectral efficiency.
2) The width $\Delta$ must be quite large to limit the complexity of the filter 24 and of the modifier 42. Specifically, the larger the width $\Delta$ the simpler the filter 24 and the modifier 42.

Preferably, the frequencies $f_j$ contained in the band Bf, are low frequencies, i.e. frequencies that are at least two or five or 10 times lower than the frequency $f_c$. For example, in this embodiment, the frequencies $f_j$ are lower than 10 GHz or 6 GHz. Specifically, oscillators $Oe_j$ capable of generating such frequencies $f_j$ are simple and generally exhibit very little phase noise. Thus, the signal $s_{fi}(t)$ that is generated using such low-frequency oscillators will also exhibit little phase noise. Below, this signal $s_{fi}(t)$ is also called the "intermediate-band signal".

Here, by way of example, the orthogonal basis $\{\psi_j\}$ is a Fourier orthogonal basis defined by the following relationship, relationship (3):

$$\Psi_j(t) = \sqrt{2} \cdot \cos(\omega_j \cdot t + \theta_j)$$

$$\omega_j = \left(m + F\left[\frac{j}{2}\right]\right) \cdot \frac{1}{T}$$

where:
$w_j$ is equal to $2\pi f_j$, where $f_j$ is an intermediate frequency chosen in the intermediate band $B_{fi}$,
m is a natural integer higher than 1,
F[..] is the floor function, which returns the integer part of the number between square brackets, and
$\theta_j$ is an initial phase shift.

The initial phase shift $\theta_j$ is equal to $\theta_0$ when j is even and equal to $\theta_0 - \pi/2$ when j is uneven. In addition, below, each channel j will be considered to be ideally compensated in the receiver and therefore $\theta_0$ will be considered to be equal to zero. Here, m is chosen strictly higher than 1 because this facilitates the filtering of the images after the frequency conversion from the intermediate band to the high-frequency band.

With this orthogonal basis $\{\psi_j\}$, the signal $s_{fi}(t)$ is defined by the following relationship, relationship (4):

$$s_{f_i}(t) = \sum_j s_j(t) \cdot \sqrt{2} \cos(\omega_j \cdot t + \theta_j)$$

Given that the phase noise of the oscillators that generate the carriers at the frequencies $f_j$ is very low, it is neglected in the following relationships.

Before the conversion of the signal $s_{fi}(t)$ from the intermediate band $B_{fi}$ to the high-frequency band, in a step 68, the adder 16 adds a constant $v_0$ to the signal $s_{fi}(t)$ to obtain the signal $s_{DC}(t)$. The signal $s_{DC}(t)$ is therefore defined by the following relationship:

$$s_{DC}(t) = s_{fi}(t) + v_0$$

In addition, the constant $v_0$ is chosen so as to respect the following relationship, relationship (6), and to do so for all the possible values of t:

$$v_0 \geq -\min_{t \in R} s_{f_i}(t)$$

where "min $s_{fi}(t)$" is the function that returns the lowest value of the signal $s_{fi}(t)$ when t belongs to the set of positive real numbers. Under these conditions, the signal $s_{DC}(t)$ is a signal that is always higher than or equal to zero. Thus, this signal $s_{DC}(t)$ may be used to modulate the envelope of a carrier in the high-frequency band. For example, to do this the signal $s_{DC}(t)$ is used directly to control an amplifier of the power of the high-frequency carrier.

In a step 70, the multiplier 20 carries out a frequency conversion. The frequency conversion allows the signal $s_{fi}(t)$ to be moved from the intermediate band $B_{fi}$ to a high-frequency band. This conversion converts the signal $s_{fi}(t)$ into a signal $s_{fc}(t)$ located in the high-frequency band. The signal $s_{fc}(t)$ is defined by the following relationship, relationship (7):

$$s_{fc}(t) = s_{DC}(t) \cdot \cos(w_c \cdot t + \phi_{fc}(t)),$$

where:
$w_c$ is equal to $2\pi f_c$, where $f_c$ is the frequency of the high-frequency carrier generated by the oscillator 22,
$\phi_{fc}(t)$ is the phase noise introduced by the oscillator 22 that generates the carrier at the frequency $f_c$.

The frequency $f_c$ is located in the high-frequency band. The phase noise $\phi_{fc}(t)$ of the oscillator that generates the carrier at the frequency $f_c$ is therefore generally substantial.

Relationship (7) may also be written in the form of the following relationship, relationship (8):

$$s_{fc}(t) = \sum_j s_j(t) \cdot \frac{\sqrt{2}}{2}(\cos((w_c + w_j) \cdot t + \theta_j + \phi_{fc}(t)) + \cos((w_c - w_j) \cdot t - \theta_j - \phi_{fc}(t))) + v_0 \cos(w_c \cdot t + \phi_{fc}(t))$$

Relationship (8) shows that most of the power of the power spectrum of the signal $s_{fc}(t)$ is distributed between:
a component of amplitude $v_0$ at the frequency $f_c$,
a low-frequency sideband located to the left of the frequency $f_c$ and given by the terms containing the expression $(w_c - w_j) \cdot t$, and
a high-frequency sideband located to the right of the frequency $f_c$ and given by the terms containing the expression $(w_c + w_j) \cdot t$.

Each of these sidebands contains an image of the useful signal, i.e. here an image of the signal $s_{fi}(t)$.

Here, in a step 72, to improve spectral efficiency, the low-frequency sideband is removed in order to obtain a signal s(t) containing a single sideband, or an SSB (single-sideband) signal. To do this, the signal $s_{fc}(t)$ is filtered by the filter 24. The filtered signal s(t) is defined by the following relationship, relationship (9):

$$s(t) = s_{fc}(t) * g_h(t)$$

where:
* is the symbol of the convolution operation, and
$g_h(t)$ is the impulse response of the filter 24.

In addition, to limit the power consumption of the transmitter, in step 72, the power of the carrier at the frequency $f_c$ is also decreased to decrease the ratio $P_c/P_s$, where:
$P_c$ is the power of the carrier at the frequency $f_c$, and
$P_s$ is the power of the useful signal in the high-frequency sideband.

Here, the filter 24 is able to decrease the power $P_c$ so that the ratio $P_c/P_s$ is lower than three and, preferably, lower than or equal to one. Here, the filter 24 is configured so that the ratio $P_c/P_s$ is comprised between 0.1 and 1 or between 0.3 and 0.9. For example, here, the filter 24 is such that the ratio $P_c/P_s$ is equal to 0.9.

To this end, here, the filter 24 is a bandpass filter. The lower −3 dB cut-off frequency $f_{cb24}$ of the filter 24 is typically comprised between $f_c$ and $f_c+\alpha$ or between $f_c$ and $f_c+\alpha/2$, where $\Delta$ is the width of the margin of safety. Its upper −3 dB cut-off frequency $f_{ch24}$ is higher than $f_c+\Delta+L_u$. After the frequency conversion, the margin of safety extends from the frequency fc to the start of the high-frequency sideband. Inside the margin of safety the power of the signal $s_{fc}(t)$ is negligible or zero.

The signal s(t) obtained at the end of step 72 is defined by the following relationship, relationship (10):

$$s(t) = \sum_j s_j(t) \cdot \sqrt{2} \cdot \cos((w_c + w_j)t + \theta_j + \phi_{fc}(t)) + v_1 \cos(w_c \cdot t + \phi_{fc}(t))$$

where $v_1$ is the amplitude of the carrier at the frequency $f_c$.

Here, the filter 24 possesses an energy of 2 to compensate for the factor ½ of relationship (8).

The amplitude $v_1$ is lower than or equal to the amplitude $v_0$. Most of the energy of the signal s(t) is comprised in a high-frequency band $B_{tot}$ comprised between a frequency $f_{min}$ and a frequency $f_{max}$. The frequency $f_{min}$ is equal to the frequency $f_c$. The frequency $f_{max}$ is equal to $f_c+f_i+L_u/2$. The frequency $f_{max}$ is also equal to $f_c+\Delta+L_u$.

In a step 74, the signal s(t) is transmitted to the receiver 4 via the point 26. Here, the signal s(t) is transmitted over the air by the antenna to the receiver 4, to which there is a direct line of sight.

Steps 62 to 44 are reiterated for each digital symbol to be transmitted.

In parallel to the transmitting phase 60, the receiver executes the phase 80 of receiving the signal s(t).

In a step 82, the receiver 4 receives the signal r(t) via the receiving antenna of the point 30 of input.

The propagation of the signal s(t) through the air introduces noise b(t) into this signal. In the high-frequency band, the noise b(t) may be modeled by additive white Gaussian noise. The white noise b(t) is a stationary stochastic process of zero mean and of spectral density $N_0$. The received signal r(t) is therefore defined by the following relationship, relationship (11):

$$r(t) = s(t) + b(t)$$

In a step 84, firstly, the signal r(t) is filtered by the filter 32. The filter 32 is configured to avoid aliasing of the spectrum of the noise b(t), which extends beyond the band $B_{tot}$ in the receiver. Specifically, such aliasing would degrade the signal-to-noise ratio inside the receiver. To this end, the filter 32 is a bandpass filter. The passband of the filter 32 is sufficiently wide to completely encompass the band $B_{tot}$ and sufficiently narrow to attenuate as much as possible noise located outside of the band $B_{tot}$. The passband of the filter 32 lies between two −3 dB cut-off frequencies denoted $f_{c32min}$ and $f_{c32max}$, respectively. For example, the frequency $f_{c32min}$ is comprised between $f_{min}-\Delta$ and $f_{min}$. For example, the frequency $f_{c32max}$ is comprised between $f_{max}$ and $f_{max}+\Delta$. The operation carried out by the filter 32 in order to obtain the filtered signal $r_b(t)$ is defined by the following relationship, relationship (12):

$$r_b(t) = r(t) * g_b(t)$$

where $g_b(t)$ is the impulse response of the filter 32.

The signal $r_b(t)$ obtained at the output of the filter 32 is approximated by the following relationship, relationship (13):

$$r_b(t) = r(t) + b'(t)$$

where b'(t) is the noise introduced by the transmission channel and located inside the band $B_{tot}$. The noise b'(t) is therefore noise of band limited to the band $B_{tot}$.

In a step 86, the envelope-detecting circuit 34 receives the signal $r_b(t)$ and carries out frequency conversion of this signal $r_b(t)$ to the intermediate band. In addition, here, the circuit 34 is designed to attenuate the high phase noise $\phi_{fc}(t)$. The detailed operation of the circuit 34 is described below with reference to FIG. 5.

The signal $r_{fi}(t)$ delivered by the circuit 34 is defined by the following relationship, relationship (14):

$$r_{fi}(t) = Q(r_b(t))$$

where Q is the function that represents the operations carried out by the circuit 34 to extract the envelope of the signal $r_b(t)$.

Figure 5:
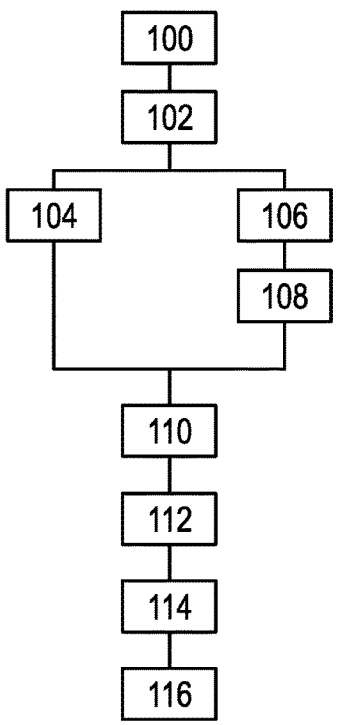
FIG. 5 is a flowchart of an envelope-detecting method using the circuit of FIG. 3.

The envelope $r_{fi}(t)$ detected by the circuit 34 may be expressed in the form of the following relationship, relationship (15):

$$r_{fi}(t) = c + b'(t) + \sum_j s_j(t) \cdot \sqrt{2} \cos(w_j \cdot t + \theta_j)$$

where "c" is a constant the origin of which is explained below with reference to FIG. 5.

In a step 88, the circuit 36 carries out carrier demapping on, or applies the analysis operator (term arising from linear algebra) to, the various sub-carriers with respect to one another. To this end, for each channel j, the circuit 36 carries out the operation generically defined by the following relationship, relationship (16):

$$r_j(t) = r_{fi}(t) \cdot \psi_j(t)$$

In the particular case of the Fourier orthogonal basis used by the transmitter 2, relationship (16) may also be written in the form of the following relationship, relationship (17):

$$r_j(t) = r_{fi}(t) \cdot \sqrt{2} \cos(w_j \cdot t + \theta_j + \phi_{fi}(t))$$

where $\phi_{fi}(t)$ is the phase noise introduced by the oscillator $O_{rj}$ that generates the carrier at the frequency $f_j$. Given that the intermediate frequencies $f_j$ are much lower than the frequency $f_c$, the phase noise $\phi_{fi}(t)$ is small and negligible.

Relationship (17) may also be written in the form of the following relationship, relationship (18):

$$r_j(t) = (b'(t) + c) \cdot \sqrt{2} \cos(w_j \cdot t + \theta_j + \phi_{fi}(t)) +$$
$$\sum_{n_0} s_{n_0}(t) \cdot \cos((w_{n_0} - w_j)t + (\theta_{n_0} - \theta_j) - \phi_{fi}(t)) +$$
$$\sum_{n_0} s_{n_0}(t) \cdot \cos((w_{n_0} + w_j)t + (\theta_{n_0} + \theta_j) + \phi_{fi}(t))$$

where the index $n_0$ is an index that varies from 1 to N.

The constant "c" present in relationship (18) has no impact since its projection onto $\psi_j(t)$ is zero.

Lastly, in a step 90, for each channel j, the symbol $S_j[k]$ modulated at the time k in the channel j is demodulated, by the demodulator $D_j$. The demodulator $D_j$ is for example a conventional demodulator. Typically, the operation carried out by the demodulator $D_j$ is defined by the following relationship, relationship (19):

$$\hat{s}_j[k] = r_j(t) * g^*(-t), t = kT$$

where:
$\hat{s}_j[k]$ is the estimation of the symbol $s_j[k]$ constructed by the demodulator Dj, and
$g^*(t)$ is the impulse response of the appropriate filter.

Lastly, in a step 92, each estimated symbol $\hat{s}_j[k]$ is delivered on its respective port $P_{sj}$.

Steps 82 to 92 are reiterated for each of the transmitted digital symbols.

The operation of the circuit 34 is now described in more detail with reference to the method of FIG. 5.

In a step 100, the circuit 34 receives the signal $r_b(t)$ on its port $P_{e34}$. Below, in the explanation of the operation of the circuit 34, the noise b'(t) in the signal $r_b(t)$ is neglected. The signal $r_b(t)$ in which the noise has been neglected is denoted $s_{v1}(t)$. The signal $s_{v1}(t)$ is defined by the following relationship, relationship (20):

$$s_{v1}(t) = \sum_j s_j(t) \cdot \sqrt{2} \cos((w_c + w_j)t + \theta_j + \phi_{fc}(t)) + v_1 \cos(w_c \cdot t + \phi_{fc}(t))$$

Below, this signal $s_{v1}(t)$ is written in the form defined by the following relationship, relationship (21):

$$s_{v1}(t) = s_{fc+}(t) + v_1 \cos(w_c \cdot t + \phi_{fc}(t))$$

where $s_{fc+}(t)$ corresponds to the terms containing $\cos(w_c + w_j)$ of relationship (20), i.e. to the useful signal contained in the high-frequency sideband.

In a step 102, the signal $s_{v1}(t)$ is duplicated to obtain two identical examples of this signal. Each example of the signal $s_{v1}(t)$ is then processed in parallel in two separate branches of the circuit 34.

In a step 104, the copy of the signal $s_{v1}(t)$ that takes the top branch in the schematic shown in FIG. 3 is multiplied by itself by the multiplier 40 to obtain a signal $s_{v1}(t)^2$. The multiplier 40 therefore carries out the operation defined by the following relationship, relationship (22):

$$s_{v1}(t)^2 = s_{fc+}(t)^2 + 2s_{fc+}(t)v_1 \cos(w_c \cdot t + \phi_{fc}(t)) + v_1^2 \cdot \cos(w_c \cdot t + \phi_{fc}(t))^2$$

The term in the middle of relationship (22) may also be written in the form defined by the following relationship, relationship (23):

$$s_{fc+}(t) \cdot \cos(w_c \cdot t + \phi_{fc}(t)) = \frac{1}{2} \sum_j s_j(t) \cdot \sqrt{2} \cos(w_j t + \theta_j) +$$
$$\frac{1}{2} \sum_j s_j(t) \cdot \sqrt{2} \cos((2w_c + w_j)t + \theta_j + 2\phi_{fc}(t))$$

Thus, this term in the middle of relationship (22) may also be written in the shortened form defined by the following relationship, relationship (24):

$$s_{fc+}(t) \cdot \cos(w_c \cdot t + \phi_{fc}(t)) = \frac{s_{fi}(t)}{2} + \frac{s_{2fc}(t)}{2}$$

where $s_{2fc}(t)$ corresponds to the terms containing $\cos(2w_c + w_j)$ in relationship (23).

In parallel, in the bottom branch of the circuit 34, in a step 106, the copy of the signal $s_{v1}(t)$ is filtered by the modifier 42 to obtain a signal $s_{v2}(t)$. The signal $s_{v2}(t)$ is identical to the signal $s_{v1}(t)$ except that the constant $v_1$ has been replaced by a different constant $v_2$. Here, the constant $v_2$ is smaller than the constant $v_1$. To this end, the modifier 42 is configured to attenuate the power of the carrier at the frequency $f_c$ without affecting the useful signal located in the high-frequency sideband. For example, to this end, the modifier 42 is a high-pass filter the −3 dB cut-off frequency $f_{c42}$ of which is comprised between $f_c$ and $f_c + \Delta$ or between $f_c$ and $f_c + \Delta/2$, where $\Delta$ is the width of the margin of safety that extends from the frequency $f_c$ to the start of the high-frequency sideband.

Next, in a step 108, the signal $s_{v2}(t)$ is multiplied by itself by the multiplier 44 to obtain a signal $s_{v2}(t)^2$. This step is identical to the step 104 except that the signal multiplied by itself is the signal $s_{v2}(t)$ instead of the signal $s_{v1}(t)$.

In a step 110, the signals $s_{v1}(t)^2$ and $s_{v2}(t)^2$ are subtracted from each other, by the subtractor 46, to obtain the signal $d_{fi}(t)$. The subtractor 46 therefore executes the operation defined by the following relationship, relationship (25):

$$s_{v_1}(t)^2 - s_{v_2}(t)^2 = \frac{v_1^2 - v_2^2}{2}(1 + \cos(2w_c t + 2\phi_{f_c}(t))) + (v_1 - v_2)(s_{f_i}(t) + s_{2f_c}(t))$$

In a step 112, the signal $d_{fi}(t)$ is divided by a constant equal to $(v_1-v_2)$ by the divider 48 to obtain a signal $s_{fi+}(t)$. The divider 48 therefore carries out the operation defined by the following relationship, relationship (26):

$$s_{f_i+}(t) = \frac{s_{v_1}(t)^2 - s_{v_2}(t)^2}{v_1 - v_2} = s_{f_i}(t) + \frac{v_1 + v_2}{2} + s_{2f_c}(t) + \frac{v_1 + v_2}{2}\cos(2w_c \cdot t + 2\phi_{f_c}(t))$$

Relationship (26) shows that the signal $s_{fi+}(t)$ is composed of the useful signal $s_{fi}(t)$ added to a constant $(v_1+v_2)/2$ and of signals of frequencies higher than or equal to $2f_c$.

In a step 114, the filter 50 removes the components of the signal $s_{fi+}(t)$ the frequencies of which are higher than or equal to $2f_c$ to obtain the signal $r_{fi}(t)$. To this end, here, the filter 50 is a high-pass filter the −3 dB cut-off frequency $f_{c50}$ of which is comprised between $f_i+L_u/2$ and $2f_c$. Under these conditions, the filter 50 does not remove the constant $(v_1+v_2)/2$, the effect of which is removed by the analysis operator (carrier demapping) defined by relationship (16). The filter 50 therefore executes the operation defined by the following relationship:

$$r_{f_i}(t) = s_{f_i+}(t) * g_i(t)$$

where $g_i(t)$ is the impulse response of the filter 50.

Thus, on output from the filter 50, the signal $r_{fi}(t)$ is that defined by relationship (15) introduced above. The circuit 34 therefore indeed allows the useful signal to be transposed from the high-frequency band to the intermediate band without needing to use to do so a local oscillator that generates a signal at the frequency $f_c$.

In a step 116, the signal $r_{fi}(t)$ is delivered on the output port $P_{s34}$.

Section II: Variants

What was described above in the particular case of wireless transmission of the modulated signal s(t) between the transmitter and the receiver may also be applied to the case where the signal s(t) is propagated inside a wired link connecting the point of output of the transmitter to the point of input of the receiver. For example, this wired link is an optical fiber.

In one simplified embodiment, the number N of sub-carriers is equal to 1. In this case, the transmitter 2 comprises a single modulator $M_1$, a single multiplier $X_{e1}$, and a single oscillator $O_{e1}$. The adder 14 is omitted and the output of the multiplier $X_{e1}$ is connected directly to the input of the adder 16. Correspondingly, the receiver comprises a single multiplier $X_{r1}$, a single oscillator $O_{r1}$ and a single demodulator $D_1$.

In the case where the digital symbols are modulated by orthogonal modulation on one sub-carrier j by the modulator $M_j$, the time-dependent signal $s_j(t)$ is given by the following relationship:

$$s_j(t) = \sum_k \varphi_{i_j[k]}(t - kT)$$

where:
$i_j[k]$ is the index modulated at the time k on the carrier j, $\{\varphi_i(\ )\}$ is a set of orthogonal signals belonging to $L^2([0, T])$.

In the case where an orthogonal modulation is used in the channel j, the demodulator $D_j$ must be adapted correspondingly. For example, the demodulator $D_j$ is in this case a correlation block. Such a correlation block is for example described in the following document: John G. Proakis: "Digital Communication", 4th edition.

It is possible to use orthogonal bases other than a Fourier orthogonal basis as described in the preceding example. For example, it is also possible to use a Hadamard orthogonal basis or a polynomial orthogonal basis or even a wavelet basis. To obtain bibliographic references with respect to implementation of a polynomial orthogonal basis, the reader may consult the following article: M. Srinivasan, "Comparison of prime codes, extended prime codes and quadratic congruence code using normalized throughput metric", Transparent Optical Networks, 2004. Proceedings of 2004 6th International Conference on, vol. 2, pp 168-171, 4-8 Jul. 2004

In step 72, it is possible to remove the high-frequency sideband and thus preserve the low-frequency sideband. A signal with a single sideband is thus also obtained in this case. The described receiving method must then be adapted to take into account the fact that the sideband that contains the useful signal is now located on the left, and no longer on the right, of the frequency $f_c$. In particular, the filter 24 must be adapted to attenuate the amplitude of the carrier at the frequency $f_c$ without attenuating the useful signal. For example, in this case, the filter 24 is a low-pass filter and no longer a high-pass filter. Its cut-off frequency $f_{c24}$ is chosen to attenuate the amplitude $v_0$ without attenuating the useful signal.

In another embodiment, the transmitted signal comprises both the high-frequency and low-frequency sidebands. To achieve this, the impulse response $g_h(t)$ of the filter 24 is adapted to obtain a signal s(t) comprising both sidebands. For example, the filter 24 is a bandpass filter that attenuates only the power of the carrier at the frequency $f_c$ without modifying the power of the useful signal in the sidebands. The receiver described above is able to receive such a signal s(t) and may therefore be left unchanged. However, in this case, because of the filter 32, only the useful signal in one of the two sidebands of the received signal is exploited by this receiver. As a variant, the filter 32 is modified to let both sidebands pass. In the latter case, the modifier 42 of the circuit 34 must also be adapted to attenuate the amplitude $v_1$ of the carrier at the frequency $f_c$ without attenuating the useful signal comprised in the high- and low-frequency sidebands of the received signal. The receiver thus adapted then exploits the useful signal comprised in both sidebands of the received signal.

In one very simplified embodiment, the filter 24 also does not attenuate the amplitude of the carrier at the frequency $f_c$. In this case, the constant $v_1$ is equal to the constant $v_0$.

In one simplified embodiment, the divider 48 is omitted. In this case, the signal $r_{fi}(t)$ delivered by the circuit 34 does not have the same amplitude as the transmitted signal $s_{fi}(t)$. However, this difference in amplitude between the transmitted signal and the signal to be demodulated may be corrected subsequently in the reception chain used to receive the signal. For example, this difference in amplitude may also be corrected by the circuit 36 or by the demodulator D.

As a variant, the filter 50 may also be a bandpass filter configured to remove not only the components of the signal $s_{fi+}(t)$ the frequencies of which are higher than or equal to $2f_c$ but also the constant $(v_1+v_2)/2$.

The various variants described here may be combined together.

Section III: Advantages of the Described Embodiments

The circuit 34 allows the useful signal contained in a high-frequency sideband to be transposed to the intermediate band without using a local oscillator that generates a carrier at the frequency $f_c$ as is conventionally the case. In addition, the circuit 34 is simpler than that disclosed in the article by Voelcker. In particular, the circuit 34 allows the frequency conversion to be carried out without a Hilbert transform. Lastly, contrary to the receiver disclosed in the article by Voelcker, the circuit 34 is capable of correctly processing a received signal $r(t)$ in which the constant $v_1$ does not meet the condition expressed by relationship (6). Therefore, the circuit 34 is capable of processing signals of higher energy efficiency than those capable of being processed by the receiver of the article by Voelcker. It is the calculations and assumptions made in the article by Voelcker that cause the circuit described in this article to work only if, in the received signal, the power of the carrier at the frequency $f_c$ is much higher than the power of the useful signal. It has been estimated that the circuit described in the article by Voelcker operates correctly only if the power of the carrier at the frequency $f_c$ is at least three or four times higher than the power of the useful signal.

The divider 48 allows the circuit 34 to deliver on its output a signal $r_{fi}(t)$ in which the amplitude of the useful signal $s_{fi}(t)$ is identical to the amplitude of the transmitted useful signal. It is therefore not necessary to moreover correct the amplitude of the signal $r_{fi}(t)$.

By virtue of the circuit 34, the receiver 4 is capable of carrying out a coherent demodulation while avoiding the impact of the phase noise of high-frequency oscillators on communication performance.

By virtue of the circuit 36 for isolating sub-carriers, the frequency of the symbols to be demodulated transmitted on each of these sub-carriers is decreased. This therefore allows slower demodulators $D_j$ to be used while preserving a very high rate of information transmission over the link between the transmitter 2 and the receiver 4.

The fact that the transmitter attenuates the power $P_c$ of the carrier at the frequency $f_c$ so as to obtain a signal $s(t)$ in which the power $P_c$ is lower than or equal to the power $P_s$ of the useful signal in this same signal $s(t)$ allows the energy efficiency of the transmitter 2 to be improved with respect to that described in the article by Voelcker.

Transmitting a single-sideband signal limits the power consumption of the transmitter 2 and improves spectral efficiency.

The invention claimed is:

1. A circuit for detecting an envelope of a signal modulated in a high-frequency band located above 30 GHz, this circuit comprising:
   an input port able to receive the signal modulated in the high-frequency band, this modulated signal comprising an envelope modulated by a carrier at a preset frequency $f_c$ comprised in the high-frequency band, the envelope comprising a constant $v_1$ added to a desired signal $s_{fi}(t)$, portion of the power of the desired signal $s_{fi}(t)$ being comprised inside a desired frequency band centered on an intermediate frequency $f_1$ and of width $L_u$,
   an output port via which the detected envelope is delivered,
   wherein this envelope-detecting circuit comprises:
      a first multiplier connected to the input port and able:
         to multiply a first sample of the signal received on the input port by itself, and
         to deliver on an output this first sample of the received signal multiplied by itself,
      a modifier connected, in parallel to the first multiplier, to the input port, this modifier being able:
         to modify an amplitude of the power spectrum, of a second sample of the signal received on the input port, at the frequency $f_c$ without modifying the amplitude of this power spectrum in the desired frequency band, and
         to deliver on an output the modified signal,
      a second multiplier connected to the output of the modifier and able:
         to multiply the modified signal by itself, and
         to deliver on an output the modified signal multiplied by itself,
      a subtractor comprising first and second inputs connected to the outputs of the first and second multipliers, respectively, this subtractor being able:
         to subtract the signal received on its first input from the signal received on its second input, and
         to deliver on an output the result of this subtraction,
      a filter able to remove frequency components higher than or equal to $2f_c$ in a signal obtained from the signal delivered by the output of the subtractor, this filter comprising to this end a −3 dB cut-off frequency comprised between $f_1+L_u/2$ and $2f_c$, this filter being able to deliver the result of this filtering on an output connected to the output port of the envelope-detecting circuit.

2. The circuit as claimed in claim 1, wherein the circuit comprises an amplitude divider connected between the output of the subtractor and an input of the filter, this divider being able to divide the amplitude of the signal delivered on the output of the subtractor by a constant equal to $(v_1-v_2)$ and to deliver on the input of the filter the signal thus divided, the constants $v_1$ and $v_2$ being equal to the amplitudes of the carriers at the frequency $f_c$ in the signals delivered as input to the first and second multipliers, respectively.

3. A receiver for receiving a modulated signal comprising an envelope modulated by a carrier at a preset frequency $f_c$ comprised in the high-frequency band, the envelope comprising a constant $v_1$ added to a desired signal $s_{fi}(t)$, portion of the power of the desired signal $s_{fi}(t)$ being comprised inside a desired frequency band centered on a preset intermediate frequency $f_1$ and of width $L_u$, this receiver comprising:
   a point of input of the received signal modulated in the high-frequency band, a bandpass filter connected to the point of input, this bandpass filter being able:
  to attenuate noise found, in the received modulated signal, outside of the desired band and of the frequency $f_c$, and
  to deliver on an output a filtered signal, wherein the receiver comprises an envelope-detecting circuit comprising an input port connected to the output of the bandpass filter and an output port on which is delivered the detected envelope, this envelope-detecting circuit being as claimed in claim 1.

4. The receiver as claimed in claim 3, wherein the receiver comprises:
  a circuit for isolating sub-carriers, this circuit being connected to the output port of the envelope-detecting circuit and being able to separate from one another various signals transmitted simultaneously via various sub-carriers all located inside the desired frequency band, and
  demodulators connected to respective outputs of the isolating circuit and each able to demodulate the signal isolated on one sub-carrier.

5. The receiver as claimed in claim 3, wherein the point of input is an antenna able to receive the modulated signal via a wireless link.

6. A method for detecting an envelope of a signal modulated in a high-frequency band located above 30 GHz, this method comprising:
  receiving on an input port the signal modulated in the high-frequency band, this modulated signal comprising an envelope modulated by a carrier at a preset frequency $f_c$ comprised in the high-frequency band, the envelope comprising a constant $v_1$ added to a desired signal $s_{f1}(t)$, portion of the power of the desired signal $s_{f1}(t)$ being comprised inside a desired frequency band centered on an intermediate frequency $f_1$ and of width $L_u$,
  delivering the detected envelope on an output port,
wherein this envelope-detecting method comprises:
  multiplying, by a first multiplier connected to the input port, a first sample of the signal received on the input port by itself,
  modifying, by a modifier connected, in parallel to the first multiplier, to the input port, a second sample of the signal received on the input port so as to obtain a modified signal in which an amplitude of the carrier at the frequency $f_c$ is modified while an amplitude of the desired signal is left unchanged, then
  multiplying, by a second multiplier connected to the output of the modifier, the modified signal by itself,
  subtracting, by a subtractor connected to the outputs of the first and second multipliers respectively, the modified signal multiplied by itself from the first sample multiplied by itself to obtain a signal $d_{fi}(t)$,
  filtering to remove frequency components higher than or equal to $2f_c$ in the signal $d_{fi}(t)$ using a filter comprising to this end a −3 dB cut-off frequency comprised between $f_1+L_u/2$ and $2f_c$ and delivering the result of this filtering on the output port.

\* \* \* \* \*